United States Patent [19]

Hirosawa

[11] Patent Number: 4,704,927

[45] Date of Patent: Nov. 10, 1987

[54] CUTTING REPRODUCTION IMAGES OUT OF A SHEET OF EXPOSED FILM

[75] Inventor: Makoto Hirosawa, Kyoto, Japan

[73] Assignee: Dainippon Screen Mfg. Co., Ltd., Kyoto, Japan

[21] Appl. No.: 746,622

[22] Filed: Jun. 19, 1985

[30] Foreign Application Priority Data

Aug. 3, 1984 [JP] Japan ................... 59-164105

[51] Int. Cl.$^4$ .................. B26D 5/30; G05B 19/18
[52] U.S. Cl. .................................... 83/13; 83/39; 83/56; 83/71; 83/371
[58] Field of Search ............... 83/39, 49, 56, 71, 73, 83/365, 371, 554, 13; 355/29, 41, 71

[56] References Cited

U.S. PATENT DOCUMENTS

| | | | |
|---|---|---|---|
| 3,805,650 | 4/1974 | Pearl ........................ | 83/56 |
| 3,881,379 | 3/1975 | Stumpf ...................... | 83/365 |
| 3,992,965 | 11/1976 | Hell et al. ................. | 83/371 |
| 4,463,677 | 8/1984 | Kuehfuss .................... | 83/371 |
| 4,506,824 | 3/1985 | Bartz ........................ | 83/371 |
| 4,520,702 | 6/1985 | Davis et al. ................ | 83/71 |

FOREIGN PATENT DOCUMENTS

| | | |
|---|---|---|
| 1290653 | 9/1972 | United Kingdom . |
| 1450445 | 9/1976 | United Kingdom . |
| 1560472 | 2/1980 | United Kingdom . |
| 1596140 | 8/1981 | United Kingdom . |
| 2075714 | 11/1981 | United Kingdom . |
| 2138595 | 10/1984 | United Kingdom . |

*Primary Examiner*—Donald R. Schran
*Assistant Examiner*—Hien H. Phan
*Attorney, Agent, or Firm*—Lowe Price LeBlanc Becker & Shur

[57] ABSTRACT

A method of cutting reproduction images from a sheet of photosensitive film on which the images are recorded comprises controlling a cutting means in accordance with position data of exposed areas corresponding to at least one original.

5 Claims, 7 Drawing Figures

CUTTING REPRODUCTION IMAGES OUT OF A SHEET OF EXPOSED FILM

FIELD OF THE INVENTION

This invention relates to a method of cutting reproduction images from a sheet of exposed photosensitive film on which the images are recorded.

BACKGROUND OF THE INVENTION

A color scanner records plural reproduction images on a sheet of photosensitive film, which is, after being exposed and developed, cut into pieces, each containing one reproduction image. The pieces of film obtained thereby are arranged on and stuck to a transparent base sheet.

Such film cutting has hitherto been dealt with manually. Enlargement of the film sheet, however, has recently made handling of the film more troublesome. Moreover, the larger a film sheet becomes, the more images, equivalent in number to the product of the number or originals and the number of required color separations (usually 4), are recorded on it. More time is thus required to cut the images from the film sheet.

SUMMARY OF THE INVENTION

A general object of this invention is to provide an improved method of cutting reproduction images out of a sheet of developed or undeveloped photosensitive film, without any of above-mentioned problems.

It is a more particular object of this invention to provide a method of cutting images from a film sheet automatically.

This invention is characterized primarily by storing in a memory of a control unit data identifying the positions of plurality of exposed areas, which contain one or more reproduction images, and controlling a cutting device with that data.

An "exposed area" is defined as an area containing color separation images corresponding to one original arranged in a line in the main scanning direction. An exposed area contains four color separation images, Y, M, C and K, corresponding to one original when those four images are arranged in a line in the main scanning direction. When two of the four color separation images, e.g., Y and M, and the other two, e.g., C and K, are arranged in a line in the main scanning direction, respectively, each of two areas is identified as an independent exposed area for the original. When four color separation images are arranged in a line in the subscanning direction, each exposed area for one image is an independent exposed area for the original.

The position data for an exposed area contain an exposure start point (Xb, Yb), the number, nc, of color separation images arranged in a line in the main scanning direction and the size, D, of space (border space) between color separation images in an exposed area, when an area includes plural images.

Data associated with areas to be exposed in socalled composing scanners, which reproduce images corresponding to plural originals in desired positions on a photosensitive film at desired magnifications, can be utilized as the position data. It is also possible to input the position data to the memory by means of an input means attached to the control unit.

A cutter disposed opposite a recording head of the scanner may be used as well as various other practical types of cutting devices.

For protecting the surface of a cutting table or a recording head of the scanner from being damaged by a cutter, a sheet of perforated paper, to which the film is attracted by vacuum pressure, is stuck to the table. Additionally stuck to the table is a sheet of paper on which an untransferable kind of adhesive, e.g., one which is usually used to form a block copy, is spread by a spray.

The above and other objects and features of the present invention can be appreciated more fully from the following detailed description when read with reference to the accompanying drawings.

PREFERRED EMBODIMENT OF THE INVENTION

Figure 1:
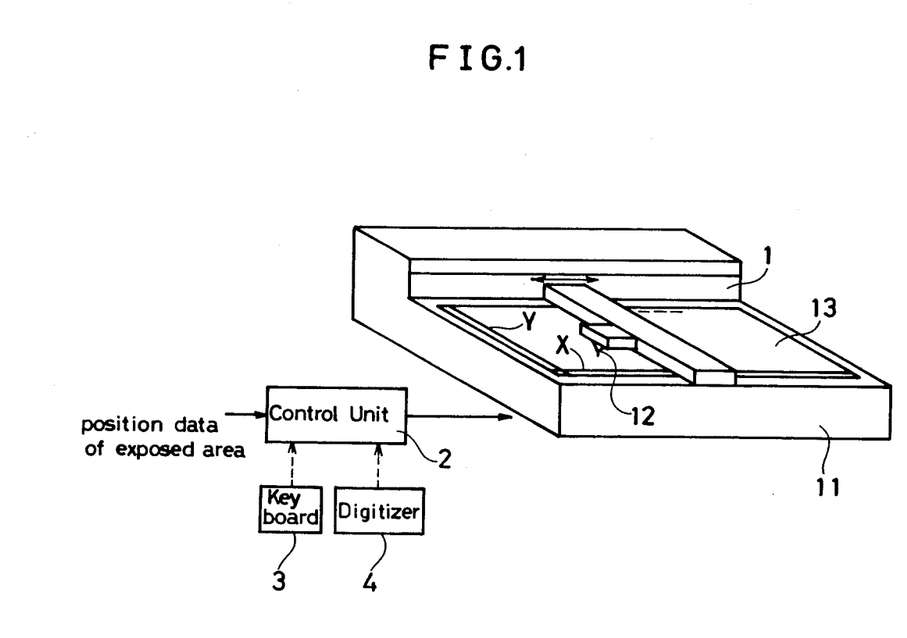
FIG. 1 is a perspective view of a preferred embodiment of the present invention.

In FIG. 1, a cutting device 1 comprises a cutting table 11 on which a developed film sheet 13 is mounted and a cutter 12 which is permitted to move two-dimensionally on the cutting table 11 to cut the film sheet 13 under the control of a unit 2. The film sheet 13 is mounted on the cutting table 11 with X and Y axes drawn on it coinciding with corresponding X and Y axes drawn on the table 11 respectively.

The data for exposure control in a composing scanner may be utilized as the position data of exposed areas, to make it unnecessary to input that data to the memory by an input means.

Table 1 shows an example of a film file carrying necessary data for a composing scanner to record reproduction images corresponding to plural originals in desired positions on a photosensitive film sheet at desired magnifications. Film files of this or some other forms are stored in a memory attached to the scanner. A method thereof is disclosed, e.g., in Japanese Patent Application No. 59-25853.

In Table 1, Film No. FNo represents a number accorded to each film sheet for identification. Film Size Fx and Fy represent length in the sub-scanning and main scanning directions of each film sheet respectively.

Figure 5:
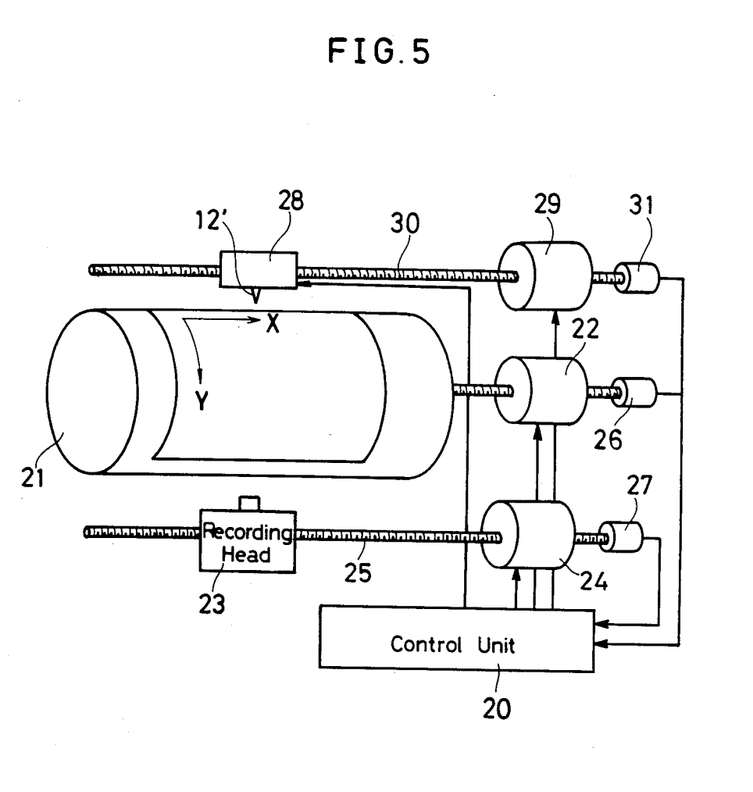
FIG. 5 shows another preferred embodiment of the present invention.
Figure 6:
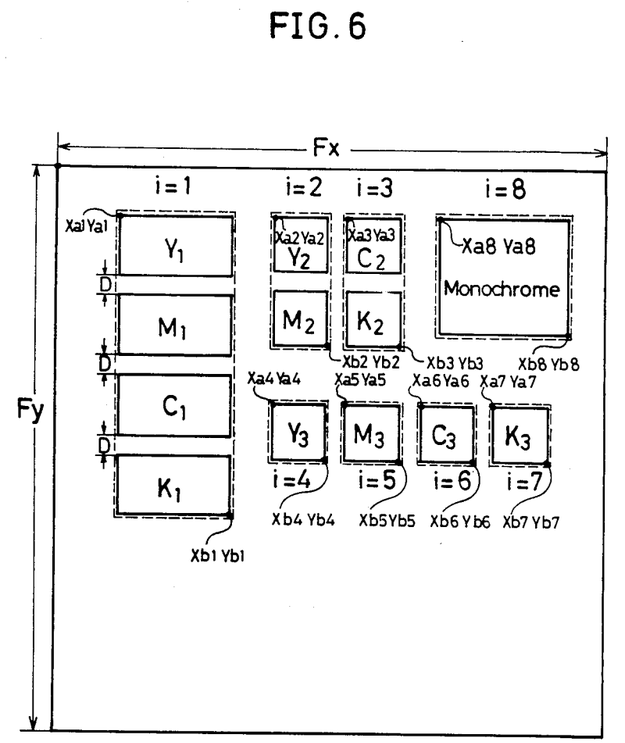
FIG. 6 is a block chart to help describe the contents of a film file.

Area Data contain the following factors:

Area No.i (i=1,2, . . . , n) represents a number accorded to each of the exposed areas, such as those enclosed with broken lines in FIG. 6, containing one or more color separation images disposed in a row in the main scanning direction corresponding to one original;

Exposure Flag $A_E(i)$ is a flag which indicates whether or not the area of Area No. i has already been exposed by a "1" or "0";

Area-in-use Flat $Af(i)$ is a flag which indicates whether or not one or more color separation images have already been allocated to the area of Area No.i, i.e., that the area has already been used or not, by a "1" or "0";

Allocated Original No. $ANo.(i)$ is a number given to an original of which color separation images are allocated to the area of Area No.i; numbers suffixed to characters Y, M, C and K in FIG. 5 represent these numbers $ANo.(i)$;

The number $Ac(i)$ identifies how many color separation images are allocated in the main scanning direction in that area; this number $Ac(i)$ is 4 when four color separation images, Y, M, C and K, are arranged in the main scanning direction in a line as in the case of area 1 (i=1) in FIG. 6, is 2 when two couples of two color separation images, Y and M, and C and K, are respectively arranged in the main scanning direction as shows in areas 2 (i=2) and 3 (i=3), and is 1 when four color separations are arranged in the sub-scanning direction as shown in areas 4 (i=4) through 7 (i=7) in the same Figure;

Coordinates $(Axa(i), Aya(i))$ indicate the exposure start point of the area of Area No.i; and Coordinates $(Axb(i), Ayb(i))$ indicate the corresponding stop point of the same area.

Although Table 1 shows a film file to expose an ordinary rectangular area, areas of any other shape, such as a circle or a polygon, are able to be handled by writing geometrical parameters of each shape in the file.

Such film files stored in on-line or off-line storage (e.g., floppy disks, cassette tapes, magnetic cards, paper tapes and so on) are transferred to the memory of the cutting device to be utilized as said position data.

It is also required in this invention to determine the size of the border around each color separation image to be cut.

Such border space cannot be larger than one-half of the size of the space D between color separation images when plural color separation images are arranged in the main scanning direction, as shown in Areas 1 through 3 in FIG. 6. When that border space is desired to be narrower than one half of the space between color separation images, or when only one color separation image is disposed in the main scanning direction as in areas 4 through 8 in FIG. 6, appropriate values are input as border space data D' in the former case of D" in the latter.

When the border space data D" is determined for an area, it is necessary to take account of spaced between neighboring areas and the present one.

Figure 2:
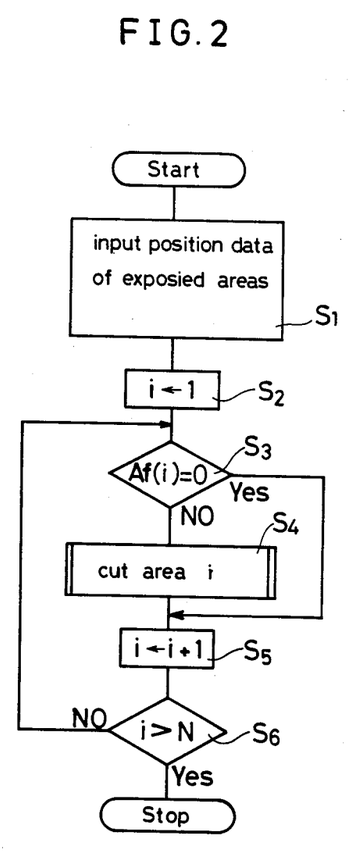
FIG. 2 is a flow chart showing steps to cut a film sheet which has been exposed and developed.

FIG. 2 is a program flow chart showing steps to cut an exposed and developed film sheet by means of the cutting device 1 controlled by the control unit 2, such as a CPU, on the basis of said data.

Initially said position data of exposed areas are input from the scanner to the memory of the control unit when an on-line system is adopted, or from an external memory such as a floppy disk in the case of an off-line system at step $S_1$.

Area No.i. is made 1 at step $S_2$. Then, it is determined whether or not the corresponding area is used, i.e., which number does the corresponding Area-in-use Flag $Af(i)$ indicate, "1" or "0", at step 3.

When the area is determined to be used, i.e., the Area-in-use Flag indicates "1", that area is cut off at step $S_4$ of which a more detailed explanation will be given later. After that, said Area No. is incremented in size by 1 at step $S_5$, and it then is determined whether that new Area No. is smaller than the largest Area No.N, at step $S_6$. When the new number is determined to be smaller than or equal to the number N, steps $S_3$ through $S_5$ are repeated on the corresponding new are. The operation of the cutting device 11 is stopped when Area No.i becomes larger than the number N. If it is determined at step $S_3$ that the present area is not used, the program proceeds directly to step $S_5$.

Figure 3:
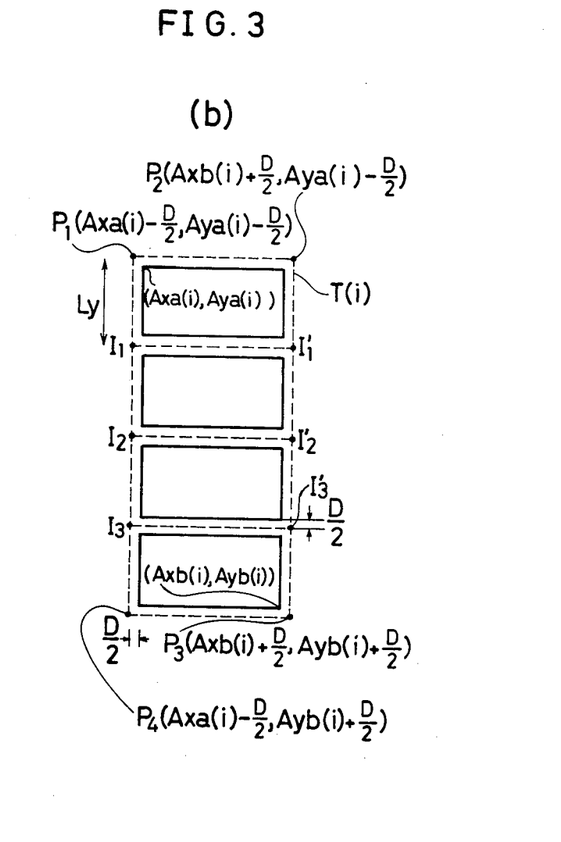
FIG. 3(a) is a flow chart showing cutting steps of the film sheet in more detail.
FIG. 3(b) is a block charge to show how color separation images are actually cut apart.
Figure 3A:
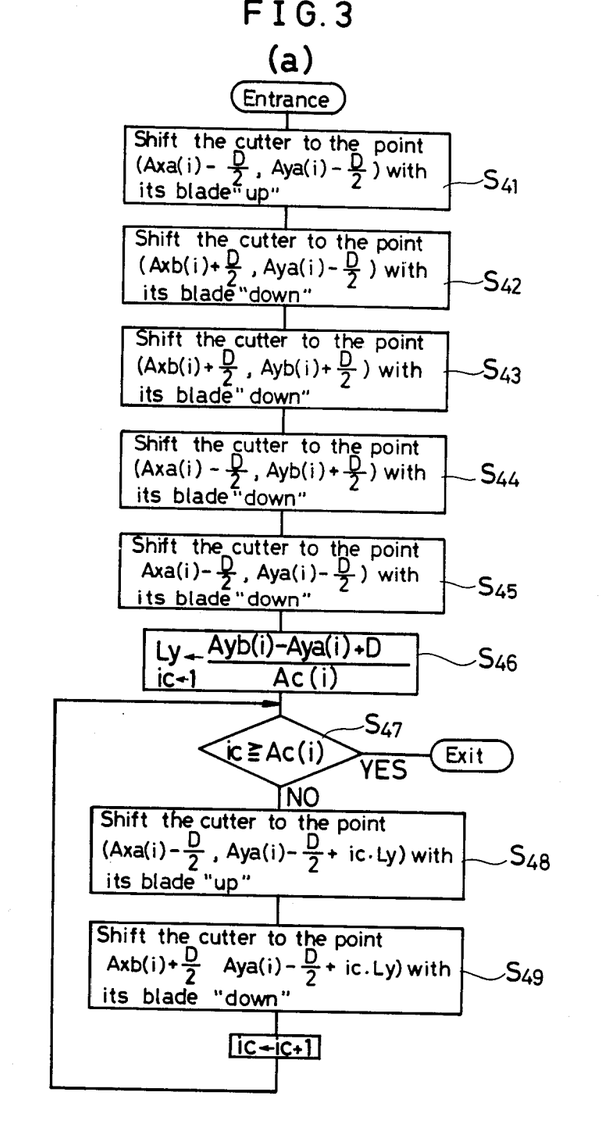

FIG. 3(a) is a program flow chart which shows cutting steps, all of which belong to step $S_4$ in FIG. 2, in more detail; FIG. 3(b) is a block chart to simplify the explanation of how color separation images are cut apart.

First, the cutter 12 is shifted with its blade "up", i.e., not in contact with the film sheet, to the start point $P_1$ $(Axa(i)-D/2, Aya(i)-D/2)$ of the cutting process at step $S_{41}$. The point $P_1$ is the left-hand end of the top line of the cutting frame T(i) that is drawn around the area i including the border space. Then, the cutter 12 proceeds to the other end $P_2$ $(Axb(i)+D/2, Aya(i)-D/2)$ of the same line with its blade directed to that point and "down", i.e., in contact with the film sheet so as to cut it, at Step $S_{42}$. At step $S_{43}$ at the point $P_2$, the blade of the cutter 12 is indexed "up", directed to the right-hand end $P_3$ of the bottom line of the cutting frame T(i), indexed "down" and then moved to that point along the main scanning direction. In the same manner the cutter 12 proceeds to the left-hand end $P_4$ of the bottom line at step $S_{44}$, then to the start point $P_1$ at step $S_{45}$ and, when the blade reaches the point $P_1$, cutting of the area i is finished. How to change the direction of the blade 12 is known in the prior art and is not described herein.

At step $S_{46}$, length Ly in the main scanning direction of one color separation image contained in the present area is calculated according to the expression:

$$\frac{Ayb(i) - Aya(i) + D}{Ac(i)}$$

and the number id of the cutting line to cut color separation images apart is set at 1. Then, when it is determined that the number id is smaller than said number $Ac(i)$ at step $S_{47}$, the cutter 12 is, after being indexed "up", shifted to a middle point $I_1$ $(Axa(i)-D/2, Aya(i)-D/2+id \cdot Ly)$ between the first and second color separation images on a side line of the cutting frame at step $S_{48}$. The first color separation is cut off at step $S_{49}$ by moving the cutter 12 to the corresponding middle point $I_1'$ $(Axb(i)+D/2, Aya(i)-D/2+id \cdot Ly)$ on the other side line of the frame along the sub-scanning direction with its blade "down".

Then, after the number id cutting line is incremented by 1 at step $S_{50}$, steps $S_{47}$–$S_{50}$ are repeated to cut off the second color separation by moving the cutter 12 along the line $I_2$–$I_2'$. The third and fourth color separations are cut apart in the same manner.

When it is determined that id is equivalent to or larger than $Ac(i)$ at step $S_{47}$, ("YES"), the program proceeds to step $S_5$ which is shown in FIG. 2. Therefore, in the cases of Areas 4–8 as shown in FIG. 6, the first time the program reaches step $S_{47}$, the result of the determination is "YES" and the program proceeds to step $S_5$.

Figure 4:
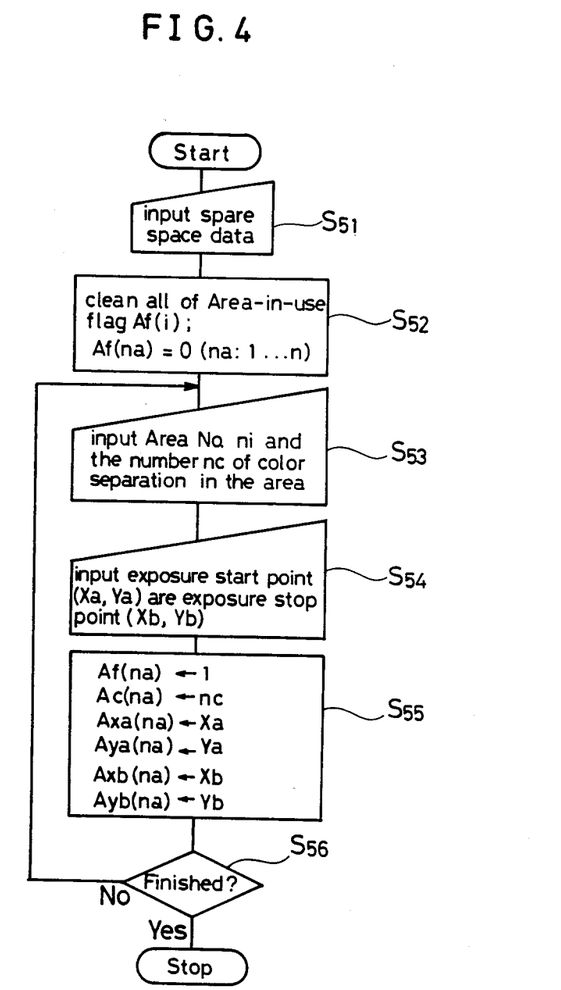
FIG. 4 is a flow chart showing steps to input position data of exposed areas to a memory by means of a keyboard or a digitizer.

It is also possible to input position data of exposed areas to the CPU by a keyboard 3 or a digitizer 4 attached to it, as shown in FIG. 1. FIG. 4 is a program flow chart for that purpose.

Initially a film sheet, which has already been exposed and developed, is placed on the digitizer 4 with the X and Y axes drawn on it coinciding with those drawn on the digitizer 4. The size D/2 of the border space for each color separation is input to the CPU by keyboard 3 at step $S_{51}$, although it is also possible to determine that size by calculation. At step $S_{52}$, all Area-in-use Flags Af(i) are cleared to indicate "0", that is Af(na)=0 (na: 1−N). Then Area No. ni of the area to be processed and the number nc of color separations which are recorded in that area are input to the CPU at step $S_{53}$. Moreover, at step $S_{54}$, pairs of coordinates (Xa, Ya), which indicate the exposure start point, and (Xb, Yb) which indicate the corresponding stop point, are input to the CPU through the digitizer 4. Thus, input data are stored in the memory in the form shown in Table 1 at step $S_{55}$. At step $S_{56}$ it is determined whether or not the necessary data to cut out each color separation image are input. if the result of that determination is "NO", steps $S_{53}$–$S_{56}$ are repeated until the result is "YES".

On the basis of input data, the cutting unit 1 is controlled in the above described way.

The digitizer 4 is able to be eliminated by making the cutting table 11 operate also as a digitizer.

FIG. 5 shows another example of a cutting device utilizing a recording drum of an image scanning system, by which it becomes possible to cut apart a film sheet which has not yet been developed.

In FIG. 5, a recording head 23 disposed opposite a recording drum 21 moves in the sub-scanning direction along a sub-scanning screw 25. Both a main scanning motor 22 which rotates the recording drum 21 and a sub-scanning motor 24 which rotates the sub-scanning screw 25 are controlled by a controller 20 on the basis of two series of timing pulses output from a main scanning encoder 26 and a sub-scanning encoder 22, coaxial with the main scanning motor 22 and the sub-scanning motor 24, respectively. To add to the above components, which are conventional within the recording portion of an image scanning system, a cutting head 28 is also disposed opposite the recording drum 21 and is permitted to move along a cutting screw 30 rotated by a cutting motor 29, in the sub-scanning direction. An encoder 31, which is coaxial with the cutting motor 29, generates timing pulses on the basis of which the cutting motor 29 is controlled by the controller 20.

The cutting head is equipped with a blade 12'. The controller 20 is able to index that blade "up" or "down", that is, to make it contact with or separate from the film sheet on the recording drum 21.

The film sheet is cut by rotating the recording drum with the blade "down" in the main scanning direction and by rotating the cutting screw 30 to move the cutting head 28 in the sub-scanning direction, in the same way as disclosed in regard to FIGS. 2 and 3.

The method of this invention is valid whether or not the film is developed. For a sheet of non-developed film which must be processed in a dark room, it is more desirable to fix some pins on the cutting table or recording drum corresponding to holes on the film sheet for receiving the pins. Additionally, since an automatic developing system cannot deal with a piece of film smaller than a certain size, the non-developed film sheet is, needless to say, cut into pieces not smaller than said minimum size.

Reproduction images can be cut from a sheet of photosensitive film automatically according to the method of this invention. This method removes many conventional drawbacks and shortens the time necessary to cut the film sheet, even when the film is rather large. Moreover, it is possible to develop more film sheets quickly by cutting apart large sheets of non-developed film is many small developers are used in place of a large one occupying a large area.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

TABLE 1

| (1) | Film No. | FNo |
|---|---|---|
| (2) | Film Size | Fx  Fy |
| (3) | Area Data | |
| | Area 1 | AE(1), Af(1), ANo(1), Ac(1), Aza(1), AYa(1), Axb(1), AYb(1), |
| | Area 2 | AE(2), Af(2), ANo(2), Ac(2), Axa(2), AYa(2), Axb(2), AYb(2), |
| | . | |
| | . | |
| | Area i | AE(i), Af(i), ANo(i), Ac(i), Axa(i), AYa(i), Axb(i), AYb(i), |
| | . | |
| | . | |
| | Area N | AE(N), Af(N), ANo(N), Ac(N), Axa(N), AYa(N), Axb(N), AYb(N), |

I claim:

1. Method of cutting each of a number of reproduction images corresponding to at least on original from a sheet of photosensitive film on which they are recorded in at least one exposed area, said reproduction images each having at least one color separation image recorded on said film, comprising the steps of:
    (a) scanning the exposed are of the at least one original and storing in a memory position data defining exposed areas each containing at least one color separation image of the original, and inputting border data defining a border size around each said at least one color separation image;
    (b) positioning the sheet of photosensitive film on a cutting device;
    (c) using the cutting device for cutting a piece which contains one exposed area from said photosensitive film sheet in accordance with said position data and said border data;
    (d) using the cutting device for cutting apart said piece of photosensitive film at said each said at least one color separation image according to the color thereof obtained during scanning;
    (e) repeating steps (c) and (d) for each exposed area of the photosensitive film sheet.

2. A method as recited in claim 1 wherein said inputting step includes inputting a border size of D/2, when plural color separation images are arranged in a line in a main scanning direction with spaced of D between successive images.

3. A method as recited in claim 1 including utilizing said position data and said border data for controlling the cutting device.

4. A method as recited in claim 1 wherein said cutting step includes moving a blade of a cutter to move two-dimensionally on a surface of a cutting table to cut photosensitive film sheet placed thereon.

5. A method as recited in claim 1 wherein the photosensitive sheet is on a recording drum, and said cutting step includes moving a cutter blade relative to a surface of the recording drum to cut said photosensitive film on said drum.

* * * * *